US007411419B1

(12) United States Patent
Truong et al.

(10) Patent No.: US 7,411,419 B1
(45) Date of Patent: Aug. 12, 2008

(54) INPUT/OUTPUT SYSTEMS AND METHODS

(75) Inventors: Kiet Truong, San Jose, CA (US); Brad Sharpe-Geisler, San Jose, CA (US); Giap Tran, San Jose, CA (US); Bai Nguyen, Union City, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 200 days.

(21) Appl. No.: 11/200,941

(22) Filed: Aug. 9, 2005

(51) Int. Cl.
*H03K 19/0175* (2006.01)

(52) U.S. Cl. .......................................... 326/62; 326/83

(58) Field of Classification Search .................... 326/62, 326/63, 68, 80, 81, 83, 86; 327/99, 112, 327/333, 530–550
See application file for complete search history.

(56) References Cited

U.S. PATENT DOCUMENTS

| | | | | |
|---|---|---|---|---|
| 6,084,444 A * | 7/2000 | Menezes | ...................... | 327/112 |
| 6,480,026 B2 * | 11/2002 | Andrews et al. | ............... | 326/39 |
| 6,657,458 B1 * | 12/2003 | Sharpe-Geisler | ............. | 326/41 |
| 6,720,755 B1 * | 4/2004 | Sharpe-Geisler | ............ | 323/314 |
| 6,759,872 B2 * | 7/2004 | Lai et al. | ........................ | 326/81 |
| 7,061,269 B1 * | 6/2006 | Agrawal et al. | ................ | 326/41 |
| 7,233,532 B2 * | 6/2007 | Vadi et al. | .............. | 365/189.12 |
| 2001/0000949 A1 * | 5/2001 | Rhee | ............................ | 326/85 |
| 2006/0170455 A1 * | 8/2006 | Torres et al. | ................... | 326/83 |

\* cited by examiner

*Primary Examiner*—Rexford Barnie
*Assistant Examiner*—Christopher Lo
(74) *Attorney, Agent, or Firm*—MacPherson Kwok Chen & Heid LLP

(57) ABSTRACT

Systems and methods are disclosed herein to provide improved I/O techniques. For example, in accordance with an embodiment of the present invention, an integrated circuit includes a reference circuit adapted to receive a first reference signal and provide a second plurality of reference signals based on the first reference signal, with the reference circuit providing default voltage levels for the second plurality of reference signals if a first control signal is asserted. An input/output circuit, coupled to the reference circuit and to an output driver, receives the second plurality of reference signals to control the output driver to provide an output signal, with the output driver operated with the default voltage levels if the first control signal is asserted.

16 Claims, 5 Drawing Sheets

US 7,411,419 B1

INPUT/OUTPUT SYSTEMS AND METHODS

TECHNICAL FIELD

The present invention relates generally to electrical circuits and, more particularly, to input/output techniques.

BACKGROUND

Input/output (I/O) circuits are employed in a wide variety of integrated circuit applications. For example, one or more I/O circuits may be incorporated into a programmable logic device (e.g., a field programmable gate array or a complex programmable logic device) to provide fast and flexible I/O capability.

A conventional I/O circuit requires one or more reference voltages for proper operation. Consequently, one drawback of the I/O circuit is that if the proper reference voltage is not provided, the I/O circuit may not operate properly. Various conventional approaches have utilized multiplexing schemes and other complicated schemes to ensure that the reference voltages are provided to the I/O circuit, but these techniques are generally impractical for low cost and low power applications. As a result, there is a need for improved I/O techniques.

SUMMARY

In accordance with one embodiment of the present invention, an integrated circuit includes a reference circuit adapted to receive a first reference signal and provide a second plurality of reference signals based on the first reference signal, wherein the reference circuit is further adapted to provide default voltage levels for the second plurality of reference signals if a first control signal is asserted; an output driver; and an input/output circuit, coupled to the reference circuit and the output driver, adapted to receive the second plurality of reference signals to control the output driver to provide an output signal, wherein the output driver is operated with the default voltage levels if the first control signal is asserted.

In accordance with another embodiment of the present invention, an integrated circuit includes means for receiving a first reference signal; means for generating a plurality of second reference signals based on the first reference signal; means for providing default voltage levels for the plurality of second reference signals if a first control signal is asserted; and means for providing an output signal based on the plurality of second reference signals, wherein the providing means operates with the default voltage levels if the first control signal is asserted.

In accordance with another embodiment of the present invention, a method of providing an output interface in an integrated circuit includes receiving a first reference signal; generating a plurality of second reference signals based on the first reference signal; generating a first control signal; providing default voltage levels for the plurality of second reference signals if the first control signal is asserted; and providing an output signal based on the plurality of second reference signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
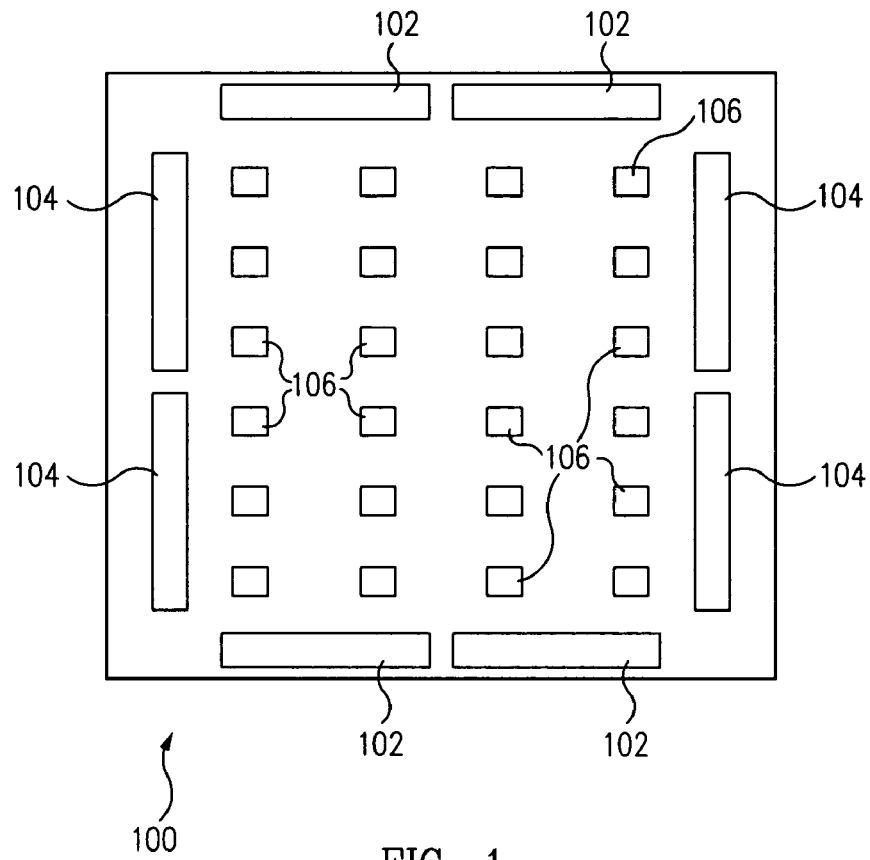
FIG. 1 shows a block diagram illustrating an exemplary integrated circuit in accordance with an embodiment of the present invention.

FIG. 1 shows a block diagram illustrating an exemplary integrated circuit 100 in accordance with an embodiment of the present invention. Integrated circuit 100 may represent any type of integrated circuit, such as for example a programmable logic device (PLD) or an application specific integrated circuit, which requires I/O or signal output functionality. For this exemplary implementation, integrated circuit 100 is shown in FIG. 1 as a programmable logic device, but it should be understood that the I/O techniques illustrated herein for one or more embodiments of the present invention may be applied to any type of interface (e.g., I/O or output only interface).

Integrated circuit 100 includes input/output (I/O) blocks 102, memory blocks 104, and logic blocks 106. I/O blocks 102 represent I/O interfaces or alternatively may represent output only interfaces for integrated circuit 100. Memory blocks 104 may be optionally included as part of integrated circuit 100 and may represent volatile or non-volatile memory or any other type of memory required based on the application or specification requirements.

Logic blocks 106 may be optionally included as part of integrated circuit 100 and may represent lookup table logic or logic arrays or any other type of logic required based on the application or specification requirements. It should be understood that any number of I/O blocks 102, memory blocks 104, and/or logic blocks 106 may be independently implemented and are not limited in any fashion. Furthermore, I/O blocks 102, as well as memory blocks 104 and/or logic blocks 106 if implemented, may be arranged in any desired fashion within integrated circuit 100 and couplable via an interconnect architecture (not shown).

Figure 2:
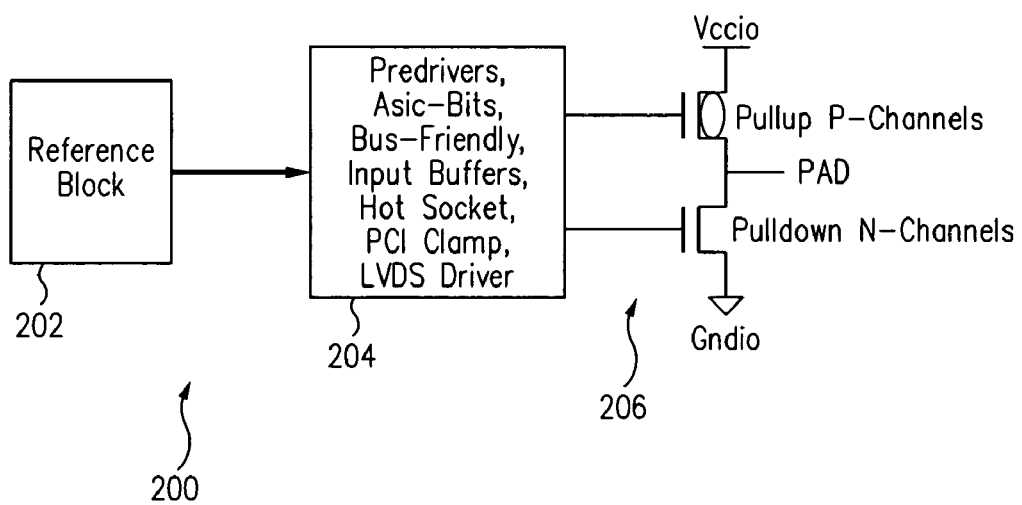
FIG. 2 shows a block diagram illustrating an exemplary circuit implementation for a portion of the integrated circuit of FIG. 1 in accordance with an embodiment of the present invention.
Figure 3A:
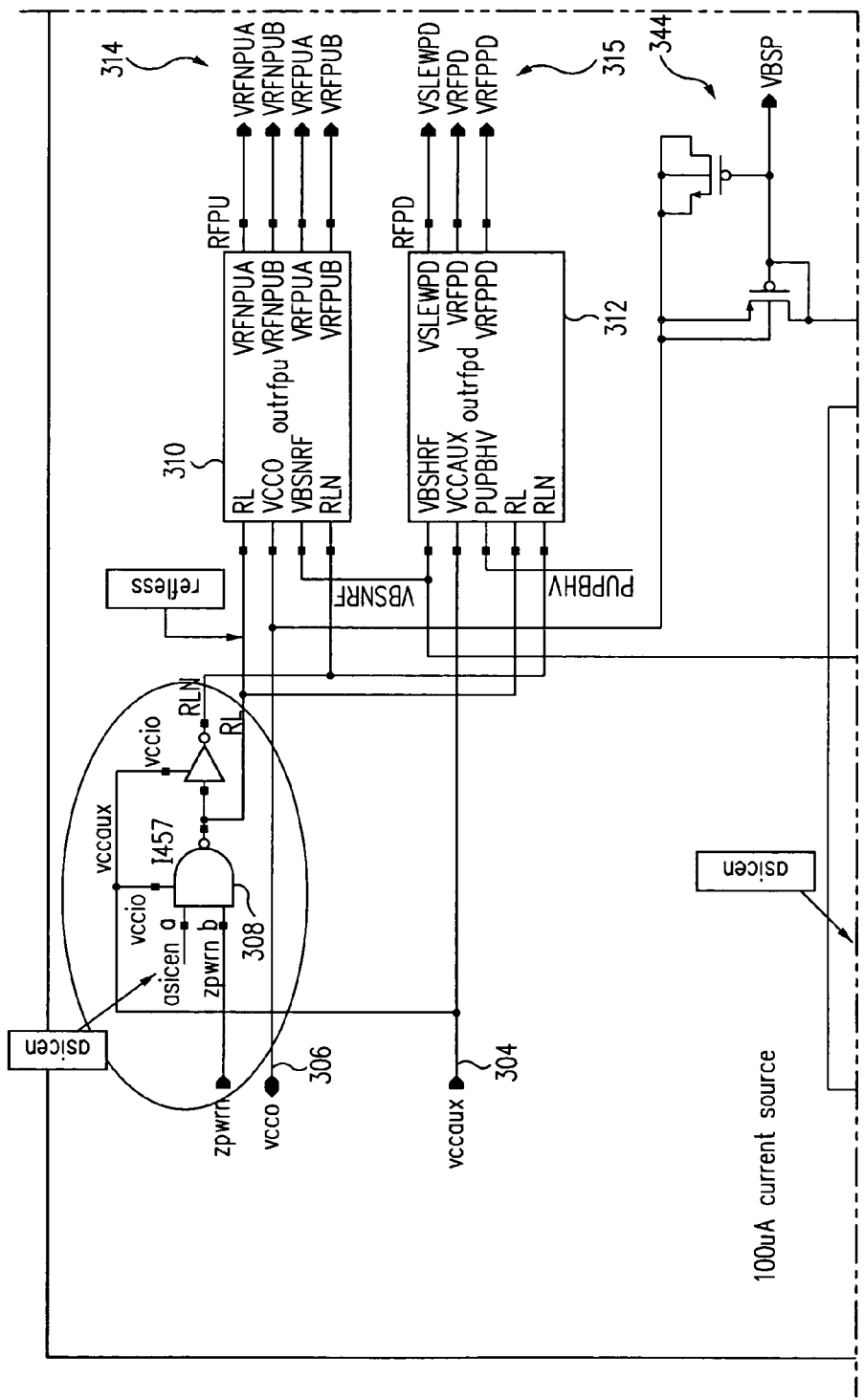
FIG. 3 shows a block diagram illustrating an exemplary circuit implementation for a portion of the circuit of FIG. 2 in accordance with an embodiment of the present invention.
Figure 3B:
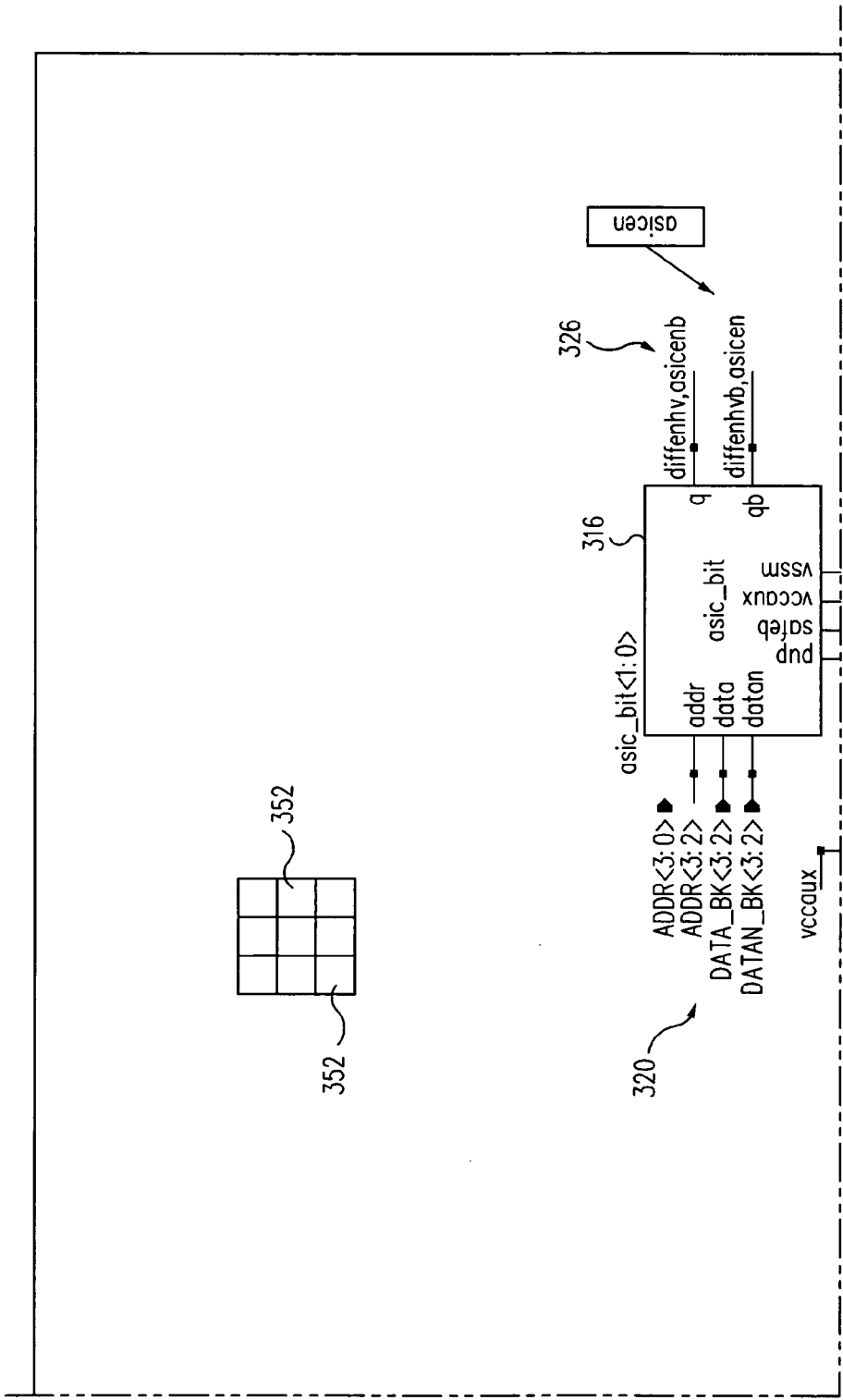
Figure 3C:
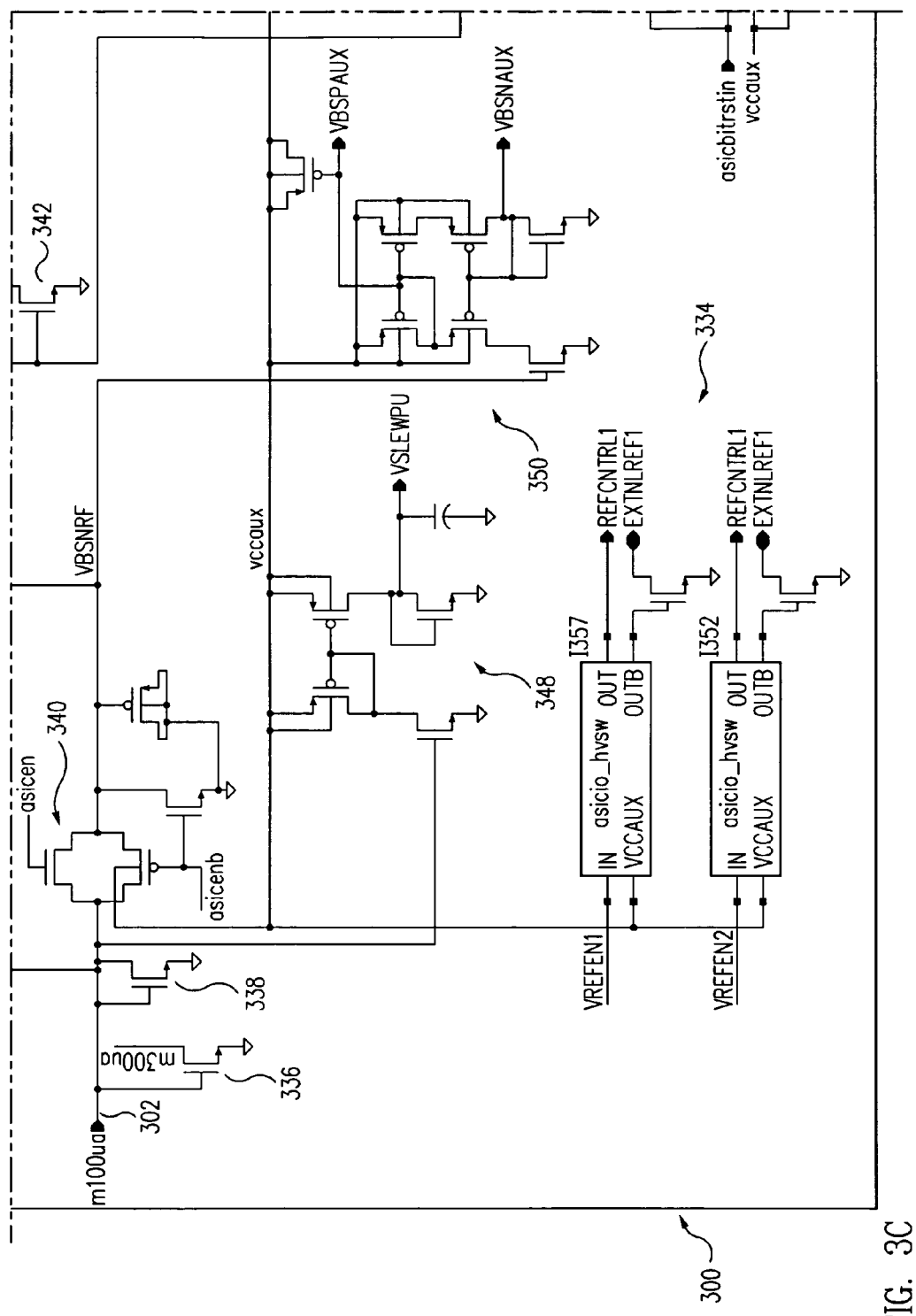
Figure 3D:
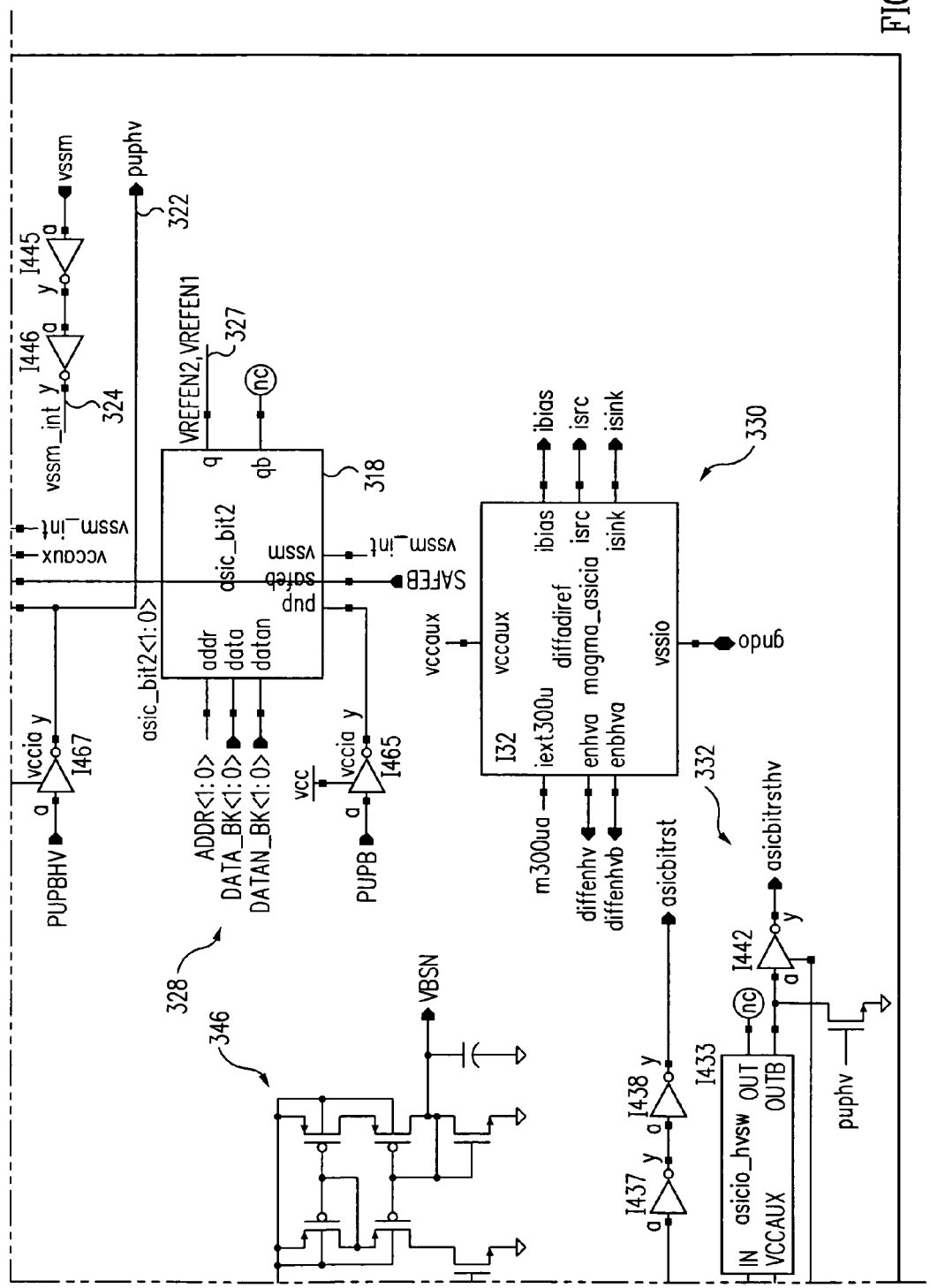

FIG. 2 shows a block diagram illustrating a circuit 200, which is an exemplary circuit implementation for one of I/O blocks 102 of FIG. 1 in accordance with an embodiment of the present invention. Circuit 200 includes a reference block 202, an I/O circuit 204, and an output driver 206.

Reference block 202 provides reference signals to I/O circuit 204, which control output driver 206 for driving data out via a pad. Output driver 206 is employed by reference block 202 and I/O circuit 204 to provide a programmable drive strength (e.g., based upon I/O specifications or a user's desired application).

I/O circuit 204 may include predrivers, asic bits, bus friendly circuits, input buffers, hot socket circuits, PCI clamps, and/or LVDS drivers, depending upon the I/O application or interface requirements. Note that I/O circuit 204 may further include output driver 206, but output driver 206 is shown separately for this example to aid in the description of circuit 200. As an example, there may be a number of I/O circuits 204 and corresponding output drivers 206 within circuit 200 (e.g., comprising one of I/O blocks 102, which may be referred to as an I/O bank in FIG. 1), with one reference block 202 within circuit 200 employed to provide the reference signals to all of I/O circuits 204 in circuit 200.

In general, for output driver 206 to switch, the gates of the P channel and the N channel transistors of output driver 206 must be driven to sufficient voltage values, which are regulated by reference block 202 and I/O circuit 204. Reference block 202 may provide generally various pull-up/pull-down reference circuits as well as other special purpose reference circuits that generate voltage reference signals for I/O circuit 204 and output driver 206 (e.g., programmable I/O driver circuitry).

Reference block 202 receives a reference signal (e.g., a reference voltage or a reference current), which is used to provide the various voltage reference signals for I/O circuit 204 and output driver 206. However, in accordance with an embodiment of the present invention, if the reference signal is not provided or not used by reference block 202, then reference block 202 provides default reference signals for I/O circuit 204 and output driver 206. For example, if the reference signal is not provided or not used, referred to herein as reference-less mode, the gates of the transistors of output driver 206 are tied to fixed voltage values, enabling output driver 206 to respond to a change to a data signal in an unregulated manner (e.g., the data signal determines whether the fixed voltage values are applied to output driver 206 for each data bit).

As an example, FIG. 3 shows a block diagram illustrating a circuit 300, which is an exemplary circuit implementation for reference block 202 of FIG. 2 in accordance with an embodiment of the present invention. Circuit 300 provides various reference signals for I/O circuit 204 and output driver 206 and provides default reference signals during reference-less mode (e.g., when a reference signal is not available or not utilized).

Circuits 316 and 318 (e.g., latches) receive address and data signals 320 and 328 (e.g., from a shift register) and based on these signals provide a first control signal 326 (complementary signals labeled asicen and asicenb) and a second control signal 327 (labeled VREFEN1 and VREFEN2). First control signal 326 determines whether various reference signals are provided to I/O circuit 204 and output driver 206 or whether default reference signals (e.g., during reference-less mode) are provided to I/O circuit 204 and output driver 206. As an example, the address and data signals 320 and 328 may be provided by a number of configuration memory cells 352, which may be set during configuration if circuit 200 is within a programmable logic device.

For this exemplary application, first control signal 326 is provided for 3.3 volt reference voltage applications (e.g., referred to as mid-voltage applications), while second control signal 327 is provided for 1.2 volt reference voltage applications. A reference signal 324 (e.g., at a ground voltage level) may be provided within or to circuit 300 as well as a reference signal 322 (e.g., a signal utilized by a hot socket circuit, such as during power up).

A conventional circuit 330 provides LVDS driver reference signals. A circuit 332 receives a global bit reset signal upon power up and generates two bit reset signals for each I/O block 102 (FIG. 1). One reset signal is for low voltage devices, while the other reset signal is for mid-voltage devices, with the reset signals resetting all of the bits in I/O circuits 204 within I/O block 102 to desired states. A circuit 334 determines whether to provide external reference voltages to I/O circuit 204 based on the specific application.

Circuit 300 receives a reference signal 302 (e.g., a 100 µA current from a current source, such as a bandgap reference circuit). Reference signal 302 may be used as a reference for various circuit applications (e.g., utilized by one or more current mirrors to provide desired reference signals). For example, reference signal 302 is used generally by circuits 344 and 346 to provide bus friendly reference signals (labeled VBSP and VBSN). Reference signal 302 may be used by circuit 348 to provide a slew rate control signal (labeled VSLEWPU), while circuit 350 uses reference signal 302 to provide differential input buffer reference signals (labeled VBSPAUX and VBSNAUX).

A transistor 336 is associated with circuit 330 to support the LVDS driver reference signals. A transistor 338 is sized appropriately relative to a transistor 342 to provide a desired reference current for circuit 344. For example, if transistor 342 is one-third the size of transistor 338 (e.g., 1*6/1 versus 3*6/1), then one-third the current (e.g., 33 µA) flows through transistor 342 relative to reference signal 302.

First control signal 326 controls a transmission gate 340, which determines whether the various circuits, such as circuits 334, 348, and 350, are utilized to provide reference signals for I/O circuit 204 or whether reference-less mode reference signals are provided for I/O circuit 204. First control signal 326 also controls a logic gate 308 (e.g., a NAND gate), which controls circuits 310 and 312. Circuits 310 and 312 receive reference signal 302 and supply voltages 304 and 306 (labeled VCCAUX and VCCO), which for example are 3.3 V and 1.2 to 3.3 V supply voltages.

Circuit 310 generally is a reference block that provides voltage references (e.g., reference signal 314) for output driver 206. Specifically, these voltage references provided via reference signal 314 may be automatically adjusted based on a voltage level (e.g., 1.2, 1.5, 1.8, 2.5, or 3.3 V) of supply voltage 306 to control the gate of the P channel transistor of output driver 206 so that output driver 206 provides sufficient drive strength (e.g., programmable drive strength). Similarly, circuit 312 generally is a reference block that provides voltage references (e.g., reference signal 315) for output driver 206. Specifically, these voltage references provided via reference signal 315 control the gate of the N channel transistor of output driver 206.

During normal operation (i.e., not reference-less mode), circuits 310 and 312 provide reference signals 314 and 315 that are set to appropriate values for the desired I/O application or specification. However, during reference-less mode, first control signal 326 turns off transmission gate 340, which removes reference signal 302 from circuits 310 and 312, and forces the output signal of logic gate 308 to an asserted value (e.g., a logical high value). Circuits 310 and 312 receive the asserted value from logic gate 308 and provide the default voltage levels (e.g., rail voltage levels) as reference signals 314 and 315 for output driver 206.

As an example, the default voltage levels provided by reference signals 314 and 315 are received by the pre-drivers within I/O circuit 204, which determines based on a data signal whether to provide the default voltage levels of reference signals 314 and 315 to output driver 206. Consequently, during reference-less mode, output driver 206 operates in an unregulated manner to provide its output signal.

As a specific example, during reference-less mode, reference signals 314 and 315 provide the pull-up and pull-down voltage reference levels, respectively, via one or more I/O circuits 204 for corresponding P channel and N channel transistors of one or more output drivers 206 within circuit 200.

For example, reference signals 314 and 315 provide ground and supply voltage reference levels, respectively, for the P channel and N channel transistors, respectively, of output drivers 206.

In general, when not in reference-less mode, reference block 202 and I/O circuit 204 operate in a conventional manner (e.g., the gates of the P and N channel transistors are regulated by the various reference circuits implemented for the desired application or I/O requirement). First control signal 326 from circuit 316 (e.g., a mid-voltage bit latch) is used to enable reference signal 302 (e.g., a 100 uA current source from the bandgap circuit), which is utilized to mirror the pull-up/pull-down reference circuits as well as other special purpose circuits (e.g., circuits 342, 344, 346, 348, and 350).

However, when in reference-less mode, first control signal 326 disconnects reference signal 302 (e.g., the current source) from the internal I/O reference circuits and in effect disables all of the references and places circuit 200 (e.g., reference block 202 and I/O circuit 204) in a power saving mode. First control signal 326 also forces the output signal (labeled refless) of logic gate 308 to an asserted value (e.g., to a high state equivalent to a VCCAUX supply voltage level). As an example, the output signal of logic gate 308 when asserted switches on pass gates within circuits 310 and 312 to drive pull-up/pull-down reference voltages to fixed values (e.g., to ground voltage and supply voltage levels), which are provided as reference signals 314 and 315 which are used to enable output driver 206.

Systems and methods are disclosed herein to provide improved I/O techniques and I/O and/or output interfaces. For example, in accordance with an embodiment of the present invention, an I/O interface is disclosed that provides conventional I/O switching along with reference-less I/O switching (e.g., for low power PLD applications). As an example, the I/O scheme allows for the I/O reference to be shut off, while still allowing the I/O driver to switch in an unregulated fashion. Furthermore, one or more configuration memory cells 352 (e.g., volatile or nonvolatile memory cells, fuses, antifuses, or similar types of memory devices as shown in FIG. 3) may be employed for configuration purposes or to set or provide one or more signals, as required for a desired application.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a reference circuit adapted to receive a first reference signal and provide a second plurality of reference signals based on the first reference signal, wherein the reference circuit is further adapted to provide default voltage levels for the second plurality of reference signals if a first control signal is asserted, wherein the default voltage levels are not based on the first reference signal;
   an output driver; and
   an input/output circuit, coupled to the reference circuit and the output driver, adapted to receive the second plurality of reference signals to control the output driver to provide an output signal, wherein the output driver is operated with the default voltage levels if the first control signal is asserted,
   wherein the reference circuit is further adapted to provide a third plurality of reference signals based on the first reference signal, wherein the third plurality of reference signals provides at least one of a slew rate control signal or differential input buffer reference signals, and wherein the first control signal prevents the first reference signal from being used to generate the third plurality of reference signals if the first control signal is asserted.

2. The integrated circuit of claim 1, wherein the input/output circuit comprises at least one of a pre-driver, an asic bit, a bus friendly circuit, an input buffer, a hot socket circuit, a PCI clamp, and an LVDS driver.

3. The integrated circuit of claim 1, wherein the first reference signal is provided by a bandgap reference circuit.

4. The integrated circuit of claim 1, further comprising a plurality of the input/output circuits and a corresponding plurality of the output drivers, wherein the reference circuit is further adapted to provide the second plurality of reference signals to the plurality of input/output circuits.

5. The integrated circuit of claim 1, wherein the default voltage levels comprise approximately a supply voltage and a ground voltage, which are provided to the output driver to operate in an unregulated manner.

6. The integrated circuit of claim 1, wherein the assertion of the first control signal to force the reference circuit to provide the default voltage levels results in a reduction of power required by the reference circuit.

7. The integrated circuit of claim 1, wherein the integrated circuit is a programmable logic device.

8. The integrated circuit of claim 1, wherein the integrated circuit is a programmable logic device further comprising:
   at least one memory block; and
   a plurality of logic blocks, wherein at least a subset of the plurality of logic blocks are couplable to at least one of the memory blocks.

9. A method of providing an output interface in an integrated circuit, the method comprising:
   receiving a first reference signal;
   generating a plurality of second reference signals based on the first reference signal;
   generating a first control signal;
   providing default voltage levels for the plurality of second reference signals if the first control signal is asserted, wherein the default voltage levels are not based on the first reference signal;
   providing an output signal based on the plurality of second reference signals; and
   generating a plurality of third reference signals based on the first reference signal, wherein the third plurality of reference signals provides at least one of a slew rate control signal or differential input buffer reference signals, and wherein the first control signal prevents the first reference signal from being used to generate the third plurality of reference signals if the first control signal is asserted.

10. The method of claim 9, wherein the default voltage levels comprise approximately a supply voltage and a ground voltage.

11. The method of claim 9, wherein the integrated circuit is a programmable logic device.

12. The method of claim 9, wherein the output signal is provided in an unregulated manner if the first control signal is asserted.

13. The method of claim 9, wherein the default voltage levels are not based on the first reference signal.

14. The integrated circuit of claim 1, further comprising configuration memory cells adapted to provide the reference circuit with an address signal and a data signal, wherein the reference circuit generates the first control signal based on the address signal and the data signal.

15. An integrated circuit comprising:
a reference circuit adapted to receive a first reference signal and provide a second plurality of reference signals based on the first reference signal, wherein the reference circuit is further adapted to provide default voltage levels for the second plurality of reference signals if a first control signal is asserted;
an output driver; and
an input/output circuit, coupled to the reference circuit and the output driver, adapted to receive the second plurality of reference signals to control the output driver to provide an output signal, wherein the output driver is operated with the default voltage levels if the first control signal is asserted,
wherein the reference circuit is further adapted to provide a third plurality of reference signals based on the first reference signal, wherein the third plurality of reference signals provides at least one of a slew rate control signal or differential input buffer reference signals, and wherein the first control signal prevents the first reference signal from being used to generate the third plurality of reference signals if the first control signal is asserted.

16. The integrated circuit of claim 15, wherein the default voltage levels comprise approximately a supply voltage and a ground voltage.

* * * * *